US012588466B2

(12) United States Patent　　　　(10) Patent No.:　　US 12,588,466 B2
Lee　　　　　　　　　　　　　　　　　　(45) Date of Patent:　　Mar. 24, 2026

(54) ARTICLE STORAGE EQUIPMENT IN SEMICONDUCTOR FABRICATION FACILITY AND LOGISTICS SYSTEM INCLUDING SAME

(71) Applicant: SEMES CO., LTD., Cheonan-si (KR)

(72) Inventor: Sung Ho Lee, Asan-si (KR)

(73) Assignee: SEMES CO., LTD., Cheonan-si (KR)

( * ) Notice: Subject to any disclaimer, the term of this patent is extended or adjusted under 35 U.S.C. 154(b) by 536 days.

(21) Appl. No.: 18/083,635

(22) Filed: Dec. 19, 2022

(65) Prior Publication Data

US 2023/0197494 A1　　Jun. 22, 2023

(30) Foreign Application Priority Data

Dec. 22, 2021　　(KR) ......................... 10-2021-0184995

(51) Int. Cl.
　　*H01L 21/677*　　　　(2006.01)
　　*H01L 21/673*　　　　(2006.01)
(52) U.S. Cl.
　　CPC .. *H01L 21/67769* (2013.01); *H01L 21/67389* (2013.01); *H01L 21/67709* (2013.01); *H01L 21/67724* (2013.01); *H01L 21/67766* (2013.01)
(58) Field of Classification Search
　　CPC ........... B60M 3/00; B60M 7/00; B65G 43/10; B65G 1/137; B60L 5/005; B60L 5/04; B60L 5/38; B60L 2200/26; B60L 2200/30; B61B 3/02
　　See application file for complete search history.

(56) References Cited

U.S. PATENT DOCUMENTS

| | | | |
|---|---|---|---|
| 9,895,977 B2 | 2/2018 | Wada | |
| 11,597,607 B2 | 3/2023 | Oh et al. | |
| 2014/0112740 A1* | 4/2014 | Feng ................ | H01L 21/67769 414/222.01 |
| 2015/0000591 A1 | 1/2015 | Kawasaki et al. | |

(Continued)

FOREIGN PATENT DOCUMENTS

| | | |
|---|---|---|
| CN | 113345823 | 9/2021 |
| KR | 10-2016-0134508 | 11/2016 |

(Continued)

OTHER PUBLICATIONS

Office Action from the Korean Intellectual Property Office dated Dec. 30, 2023.

*Primary Examiner* — Glenn F Myers

(57)　　　　ABSTRACT

Proposed are article storage equipment in a semiconductor fabrication facility, the article storage equipment being capable of power supply with a more simplified configuration, and a logistics system of a semiconductor fabrication facility including the same. Article storage equipment in a semiconductor fabrication facility according to one aspect includes a storage unit installed around a rail that provides a travel route of a transport vehicle and configured to store a transport container in which a wafer is accommodated, a purge unit configured to supply an inert gas into the transport container, a control unit configured to identify the transport container stored in the storage unit and control the purge unit to supply the inert gas into the transport container, and a power supply unit configured to supply a current induced from a power supply cable installed along the rail to the control unit.

16 Claims, 11 Drawing Sheets

(56)                    References Cited

U.S. PATENT DOCUMENTS

2021/0138911 A1*    5/2021   Mizutani ........... H01L 21/67733
2022/0097965 A1*    3/2022   Wada .................. H01L 21/6773

FOREIGN PATENT DOCUMENTS

KR          10-1674454        11/2016
KR      10-2018-0087981        8/2018
KR      10-2019-0045782        5/2019
KR          10-2190920        2/2020
KR      10-2021-0028939        3/2021
KR          10-2256132        5/2021

* cited by examiner

ARTICLE STORAGE EQUIPMENT IN SEMICONDUCTOR FABRICATION FACILITY AND LOGISTICS SYSTEM INCLUDING SAME

CROSS REFERENCE TO RELATED APPLICATION

The present application claims priority to Korean Patent Application No. 10-2021-0184995, filed Dec. 22, 2021, the entire contents of which is incorporated by reference herein for all purposes.

BACKGROUND OF THE INVENTION

Field of the Invention

The present disclosure relates to article storage equipment in a semiconductor fabrication facility, the article storage equipment being capable of simplifying an installation operation, and to a logistics system of the semiconductor fabrication facility including the same.

Description of the Related Art

Semiconductor fabrication is a process of performing several tens to hundreds of processing processes on a substrate (wafer or glass) to yield the final product. Each process is performed by fabrication equipment that performs the corresponding process. When a process in specific fabrication equipment is finished, an article (substrate) may be transported to the next fabrication equipment to proceed with the next process, and may be stored in storage equipment for a certain period of time. Here, the wafer is stored or transported in a state of being accommodated in a transport container such as a front opening unified pod (FOUP).

A distribution system refers to a system for transporting or storing articles for a fabrication process as described above, and may be largely divided into article transport equipment that transports articles and article storage equipment that stores articles.

As the article storage equipment, there is equipment having a warehouse form, such as a stocker. In addition, as equipment for temporarily storing articles around a travel route of an article transport vehicle, there may be a side track buffer installed on the side of a rail and an under track buffer installed under the rail.

Meanwhile, in the article storage equipment, such as a side track buffer or an under track buffer, there is required power supply equipment for identification of a transport container and injection of inert gases (e.g., $N_2$ gas) into the transport container, and communication equipment for data exchange with a higher-level control management device. However, recently, as the size of a semiconductor fabrication facility increases and the installation area of the article storage equipment also increases, it is becoming very difficult to install the power supply equipment and the communication equipment individually.

The foregoing is intended merely to aid in the understanding of the background of the present disclosure, and is not intended to mean that the present disclosure falls within the purview of the related art that is already known to those skilled in the art.

SUMMARY OF THE INVENTION

Accordingly, the present disclosure has been made keeping in mind the above problems occurring in the related art, and an objective of the present disclosure is to provide article storage equipment in a semiconductor fabrication facility, the article storage equipment being capable of power supply with a more simplified configuration, and to provide a logistics system of a semiconductor fabrication facility including the same.

Another objective of the present disclosure is to provide article storage equipment in a semiconductor fabrication facility, the article storage equipment being capable of communication with a more simplified configuration, and to provide a logistics system of a semiconductor fabrication facility including the same.

The objectives of the present disclosure are not limited to those mentioned above, and other objectives not mentioned will be clearly understood by those skilled in the art from the following description.

In order to achieve the above objectives, according to one aspect of the present disclosure, there is provided article storage equipment in a semiconductor fabrication facility, the article storage equipment including: a storage unit installed around a rail that provides a travel route of a transport vehicle and configured to store a transport container in which a wafer is accommodated; a purge unit configured to supply an inert gas into the transport container; a control unit configured to identify the transport container stored in the storage unit and control the purge unit to supply the inert gas into the transport container; and a power supply unit configured to supply a current induced from a power supply cable installed along the rail to the control unit.

According to an embodiment of the present disclosure, the storage unit may include: a frame installed on a side of the rail; a support stage installed on a lower surface of the frame and configured to allow the transport container to be loaded thereon; and an RFID reader installed on the support stage and configured to acquire identification information of the transport container and transmit the identification information to the control unit.

According to an embodiment of the present disclosure, the purge unit may include: a gas supply port installed in a loading slot of the support stage and configured to communicate with a gas inlet hole formed in the transport container when the transport container is mounted in the loading slot; and a gas supply part configured to supply the inert gas into the transport container through the gas supply port in response to a control signal received from the control unit.

According to an embodiment of the present disclosure, the gas supply part may transmit information on a supply state of the inert gas to the control unit.

According to an embodiment of the present disclosure, the control unit may include: an identification information acquisition unit configured to acquire the identification information of the transport container from the RFID reader; a gas supply control unit configured to transmit the control signal to the gas supply part when the transport container is identified and receive the information on the supply state of the inert gas from the gas supply part; and an output unit configured to output information on a loading state of the transport container and the supply state of the inert gas for each loading slot in which the transport container is loaded in the storage unit.

According to an embodiment of the present disclosure, the output unit may include a plurality of light emitting devices configured to respectively display the information on the loading state of the transport container and the supply state of the inert gas for each loading slot.

According to an embodiment of the present disclosure, the light emitting devices may be installed to display the information on the loading state of the transport container and the supply state of the inert gas toward a ground surface of the semiconductor fabrication facility.

According to an embodiment of the present disclosure, the power supply unit may include: a current converter configured to induce a current from the power supply cable; and a power supply line configured to supply the current from the current converter to the control unit, and the power supply line may be configured to be attached to or embedded in structures of the rail and the storage unit so as not to interfere with the transport vehicle.

According to an embodiment of the present disclosure, the current converter may include a ring-shaped core member installed to surround the power supply cable and configured to form a magnetic field by a current flowing along the power supply cable; and a coil member wound around the core member and configured to induce a current by the magnetic field.

According to another aspect of the present disclosure, there is provided article storage equipment in a semiconductor fabrication facility, the article storage equipment including: a storage unit installed around a rail that provides a travel route of a transport vehicle and configured to store a transport container in which a wafer is accommodated; a purge unit configured to supply an inert gas into the transport container; a control unit configured to identify the transport container stored in the storage unit and control the purge unit to supply the inert gas into the transport container; a power supply unit configured to supply a current induced from a power supply cable installed along the rail to the control unit; and a controller management unit connected to the control unit through wireless communication and configured to manage operation of the control unit.

According to an embodiment of the present disclosure, the storage unit may include: a frame installed on a side of the rail; a support stage installed on a lower surface of the frame and configured to allow the transport container to be loaded thereon; and an RFID reader installed on the support stage and configured to acquire identification information of the transport container and transmit the identification information to the control unit.

According to an embodiment of the present disclosure, the purge unit may include: a gas supply port installed on the support stage and configured to communicate with a gas inlet hole formed in the transport container when the transport container is mounted on the support stage; and a gas supply part configured to supply the inert gas into the transport container through the gas supply port in response to a control signal received from the control unit.

According to an embodiment of the present disclosure, the gas supply part may transmit information on a supply state of the inert gas to the control unit.

According to an embodiment of the present disclosure, the control unit may include: an identification information acquisition unit configured to acquire the identification information of the transport container from the RFID reader; a gas supply control unit configured to transmit the control signal to the gas supply part when the transport container is identified and receive the information on the supply state of the inert gas from the gas supply part; and an output unit configured to output information on a loading state of the transport container and the supply state of the inert gas for each loading slot in which the transport container is loaded in the storage unit.

According to an embodiment of the present disclosure, the output unit may include a plurality of light emitting devices configured to respectively display the information on the loading state of the transport container and the supply state of the inert gas for each support stage, and the light emitting devices may be installed to display the information on the loading state of the transport container and the supply state of the inert gas toward a ground surface of the semiconductor fabrication facility.

According to an embodiment of the present disclosure, the power supply unit may include: a current converter configured to induce a current from the power supply cable; and a power supply line configured to supply the current from the current converter to the control unit, and the power supply line may be configured to be attached to or embedded in structures of the rail and the storage unit so as not to interfere with the transport vehicle.

According to an embodiment of the present disclosure, the current converter may include: a ring-shaped core member installed to surround the power supply cable and configured to form a magnetic field by a current flowing along the power supply cable; and a coil member wound around the core member and configured to induce a current by the magnetic field.

According to an embodiment of the present disclosure, the control unit may further include a wireless communication module configured to transmit the information on the loading state of the transport container and the supply state of the inert gas for each support stage to the controller management unit.

According to an embodiment of the present disclosure, the control unit and the controller management unit may perform wireless communication through an access point installed on a ceiling of the semiconductor fabrication facility, and the controller management unit may be provided on a ground surface of the semiconductor fabrication facility, and may receive the information on the loading state of the transport container and the supply state of the inert gas from the control unit through the access point and transmit a signal for controlling the control unit to the control unit.

According to still another aspect of the present disclosure, there is provided a logistics system of a semiconductor fabrication facility, the logistics system including: a rail installed on a ceiling of the semiconductor fabrication facility and configured to provide a travel path of a transport vehicle; a power supply cable installed along the rail and configured to supply power to the transport vehicle; and article storage equipment configured to store a transport container from the transport vehicle, wherein the article storage equipment may include: a storage unit installed around the rail and configured to store the transport container in which a wafer is accommodated; a purge unit configured to supply an inert gas into the transport container; a control unit configured to identify the transport container stored in the storage unit and control the purge unit to supply the inert gas into the transport container; a power supply unit configured to supply a current induced from the power supply cable to the control unit; and a controller management unit connected to the control unit through wireless communication and configured to manage operation of the control unit.

According to the present disclosure, it is possible to supply power to the control unit of the article storage equipment with a more simplified configuration by using the current induced from the power supply cable installed along the rail.

Furthermore, according to the present disclosure, it is possible to achieve communication with a more simplified configuration by managing the operation of the control unit through the controller management unit via wireless communication.

The effects of the present disclosure are not limited to those mentioned above, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 1 a view schematically illustrating a semiconductor fabrication facility and a logistics system to which the present disclosure can be applied;

FIGS. 2 and 3 are views illustrating a logistics system of a semiconductor fabrication facility according to an embodiment of the present disclosure;

DETAILED DESCRIPTION OF THE INVENTION

Figure 3:
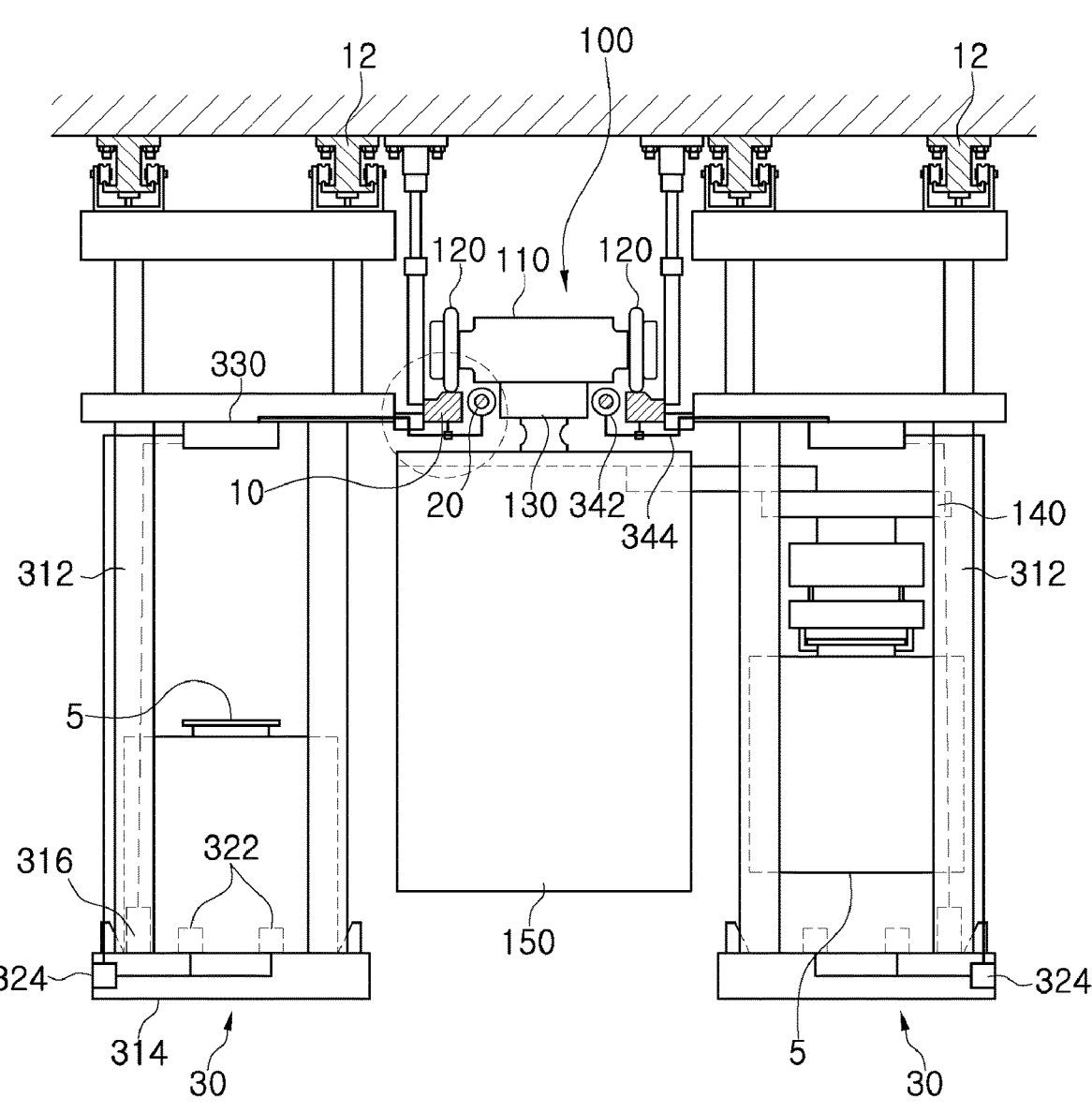

Hereinbelow, exemplary embodiments of the present disclosure will be described in detail with reference to the accompanying drawings such that the present disclosure can be easily embodied by one of ordinary skill in the art to which this disclosure belongs. The present disclosure may be embodied in many different forms and is not limited to the embodiments set forth herein.

For clarity, a description of parts not related to describing the present disclosure is omitted here, and the same reference numerals are allocated to the same or similar components throughout the disclosure.

Components having the same structure in various embodiments will be allocated the same reference numeral and explained only in a representative embodiment, and components which are different from those of the representative example will be described in the other embodiments.

As used herein, when an element is referred to as being "connected to" (or coupled to) another element, the element can be directly connected (coupled) to the other element or be indirectly connected (coupled) to the other element having an intervening element therebetween. It will be understood that the terms "comprise", "include", and/or "have" when used herein, specify the presence of stated elements but do not preclude the presence or addition of one or more other elements.

Unless otherwise defined, all terms including technical and scientific terms used herein have the same meaning as commonly understood by one of ordinary skill in the art to which the present disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
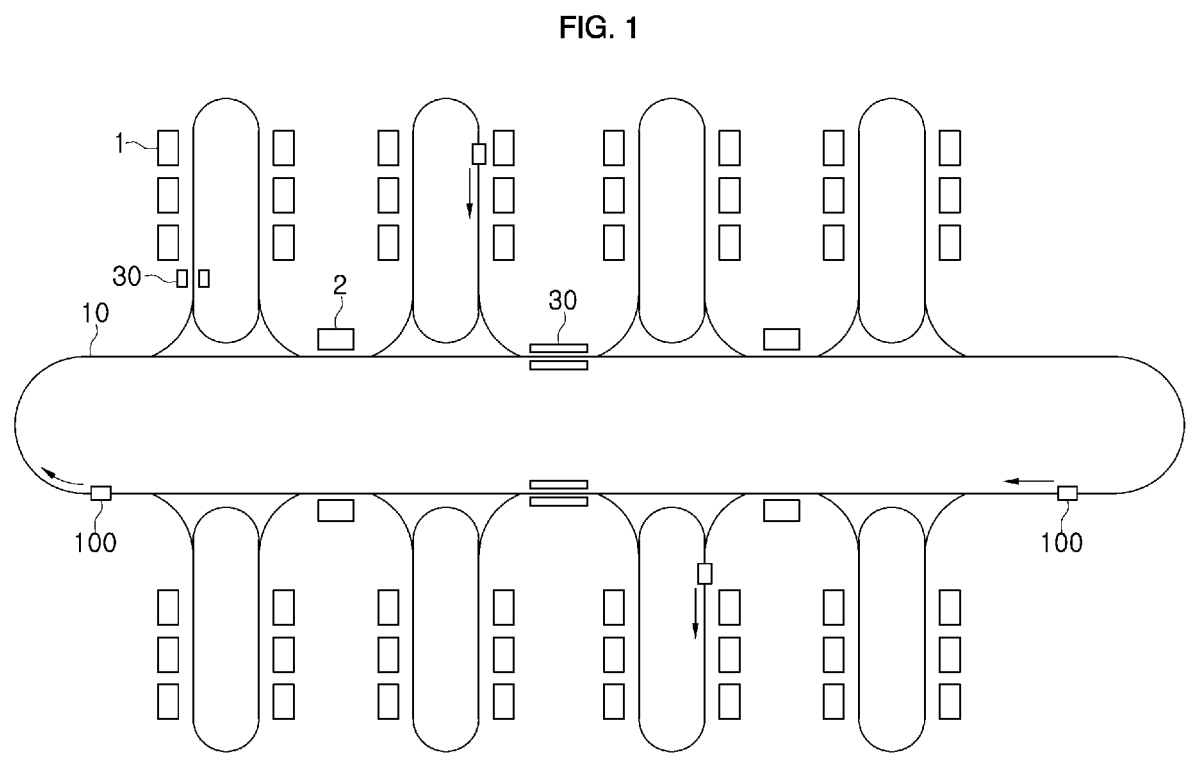

FIG. 1 a view schematically illustrating a semiconductor fabrication facility and a logistics system to which the present disclosure can be applied.

A semiconductor fabrication facility is composed of one or more clean rooms, and a plurality of fabrication equipment 1 for performing a semiconductor fabrication process may be installed in each clean room. In general, a plurality of fabrication processes are repeatedly performed on a substrate (e.g., a wafer) to complete the final product. When a fabrication process is completed in specific semiconductor fabrication equipment, the substrate is transported to equipment for the next fabrication process. Here, the wafer may be transported in a state of being stored in a transport container (e.g., a front opening unified pod (FOUP)) capable of accommodating a plurality of substrates. The transport container in which a plurality of wafers are accommodated may be transported by a transport vehicle (e.g., an overhead hoist transport (OHT)) 100.

Referring to FIG. 1, the fabrication equipment 1 for performing a process may be installed in the semiconductor fabrication facility, a rail 10 for forming a transport route (e.g., a ceiling rail) for transporting articles between the fabrication equipment 1 may be provided, and the transport vehicle 100 for transporting articles to the fabrication equipment 1 while traveling on the rail 10 may be provided. Here, when the transport vehicle 100 transports an article between the fabrication equipment 1, the article may be directly transported from specific fabrication equipment to other fabrication equipment, or the article may be stored in a storage device and then transported to the other fabrication equipment.

As the storage device, a stocker 2 having a form in which a plurality of racks are arranged may be used. In addition, as the storage device, article storage equipment 30, such as a side track buffer installed on a side of the rail 10 and an under track buffer installed under the rail 10, may be provided. In this specification, it is described as an example that the side track buffer installed on the side of the rail 10 is used as the article storage equipment 30, but the scope of the present disclosure is not limited thereto. Thus, any type of storage device installed around a travel route of the transport vehicle 100 may be applied as well as the under track buffer.

Hereinafter, the article storage equipment 30 in the semiconductor fabrication facility, the article storage equipment being capable of simplifying an installation operation, and a logistics system of the semiconductor fabrication facility including the same will be described.

Figure 2:
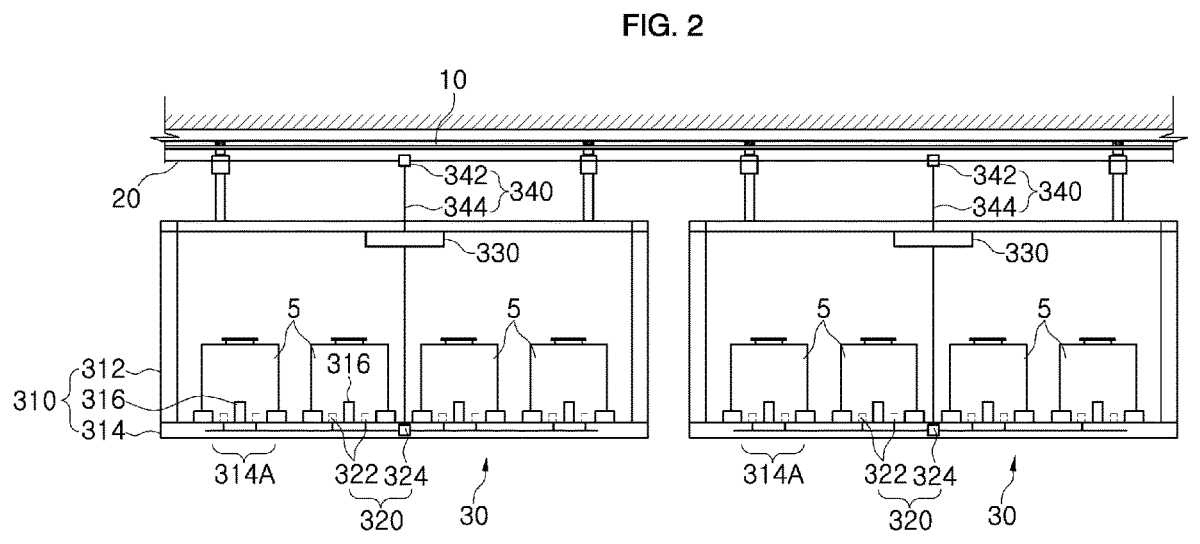

FIGS. 2 and 3 are views illustrating a logistics system of a semiconductor fabrication facility according to an embodiment of the present disclosure.

The logistics system of the semiconductor fabrication facility according to the present disclosure may include: a rail 10 installed on the ceiling of the semiconductor fabrication facility to provide a travel route of a transport vehicle 100; a power supply cable 20 installed along the rail 10 to supply power to the transport vehicle 100; and article storage equipment 30 for storing a transport container 5 from the transport vehicle 100.

As illustrated in FIGS. 2 and 3, the rail 10 provides a route for a wheel 120 of the transport vehicle 100 to travel, and may be composed of a pair of rail members. The transport vehicle 100 may travel along the rail 10 and transport the transport container 5. As illustrated in FIG. 3, the transport container 5 may be transported and loaded in the article storage equipment 30 (or fabrication equipment 1) by sliding and lifting/lowering of a hand unit for holding the transport container 5. The transport vehicle 100 may include: a traveling body 110 for generating power for acceleration or deceleration; a pair of wheels 120 coupled to the traveling body 110 and rotating along the rail 10, a power receiving part 130 for receiving power from a power supply cable 20; an article handling part 140 for holing the transport container 5 and performing transport and loading; and a frame 150 for protecting the transport container 5 and in which a sensor for front or rear detection is disposed.

The power supply cable 20 may be installed along the rail 10, and may supply power to the transport vehicle 100. The power receiving part 130 of the transport vehicle 100 may supply electric power for the operation of the transport vehicle 100 to the traveling body 110 by using an induced current generated from the power supply cable 20.

The article storage equipment 30 according to the present disclosure may include: a storage unit 310 installed on a side of the rail 10 and storing the transport container 5 in which a wafer is accommodated; a purge unit 320 for supplying an inert gas into the transport container 5; a control unit 330 for identifying the transport container 5 stored in the storage unit 310 and controlling the purge unit 320 to supply the inert gas into the transport container 5; and a power supply unit 340 for supplying a current induced from the power supply cable 20 installed along the rail 10 to the control unit 330.

According to the embodiment of the present disclosure, the storage unit 310 may include: a frame 312 installed on the side of the rail 10; a support stage 314 installed on a lower surface of the frame 312 and on which the transport container 5 is loaded; and a radio frequency identification (RFID) reader 316 installed on the support stage 314 to acquire identification information of the transport container 5 and transmit the identification information to the control unit 330.

The frame 312 is a structure that provides a space for storage of the transport container 5, and as illustrated in FIGS. 2 and 3, may be installed on each side on the rail 10 or may be installed only on one side of the rail 10. The frame 312 may be installed on the ceiling, and a bracket 12 for installation of the frame 312 may be provided on the ceiling.

The support stage 314 may be installed under the frame 312 and may provide a space in which the transport container 5 is loaded. The support stage 314 may include a plurality of loading slots 314A, each of the loading slots 314A in which the transport container 5 is loaded. The purge unit 320 for supplying the inert gas into the transport container 5 may be provided in the support stage 314.

Meanwhile, along the structures of the frame 312 and the support stage 314, a line for transmitting a signal and a power supply line 344 may be installed, and a pipe for supplying inert gases, a switch, etc. may be provided.

The RFID reader 316 may be provided for each of the loading slots 314A of the support stage 314, and may recognize a radio frequency identification (RFID) tag attached to the transport container 5 to transmit identification information of the transport container 5 to the control unit 330. Meanwhile, as a means for acquiring the identification information of the transport container 5, a marker such as a barcode or a QR code may be used as well as RFID, and a device for recognizing the corresponding marker may be used.

According to the embodiment of the present disclosure, the purge unit 320 may include: a gas supply port 322 installed in each of the loading slots 314A of the support stage 314 and communicating with a gas inlet hole (not illustrated) formed in the transport container 5 when the transport container 5 is mounted in the loading slot 314A; and a gas supply part 324 for supplying the inert gas into the transport container 5 through the gas supply port 322 in response to a control signal received from the control unit 330.

The purge unit 320 may supply the inert gas (e.g., $N_2$ gas) in order to maintain a clean environment in the inner space of the transport container 5 in which the wafer is accommodated. A plurality of gas supply ports 322 may be provided in each of loading slots 314A, and may exist at a position corresponding to the gas inlet hole provided in the transport container 5. The gas supply part 324 may be connected to an external gas supply source to supply the inert gas to the gas supply ports 322, and may include a switch for opening or closing a valve for supplying the inert gas from the gas supply source. The opening or closing of the valve may be controlled by the control unit 330. In addition, the opening or closing of the valve may be controlled according to the pressure measured inside the transport container 5. Although not illustrated, a discharge port for discharging gas inside the transport container 5 may be provided.

According to the embodiment of the present disclosure, the gas supply part 324 may transmit information on a supply state of the inert gas to the control unit 330. The gas supply part 324 may include a flow meter. The gas supply part 324 may transmit a signal instructing that the inert gas is to be supplied to the control unit 330 when a gas flow rate measured by the flow meter is greater than a reference value, and transmit a signal instructing that the inert gas is not to be supplied to the control unit 330 when the gas flow rate is less than the reference value. In addition, the gas supply part 324 may transmit a signal instructing whether to supply the inert gas to the control unit 330 according to whether the valve for controlling the supply of the inert gas is opened.

Figure 4:
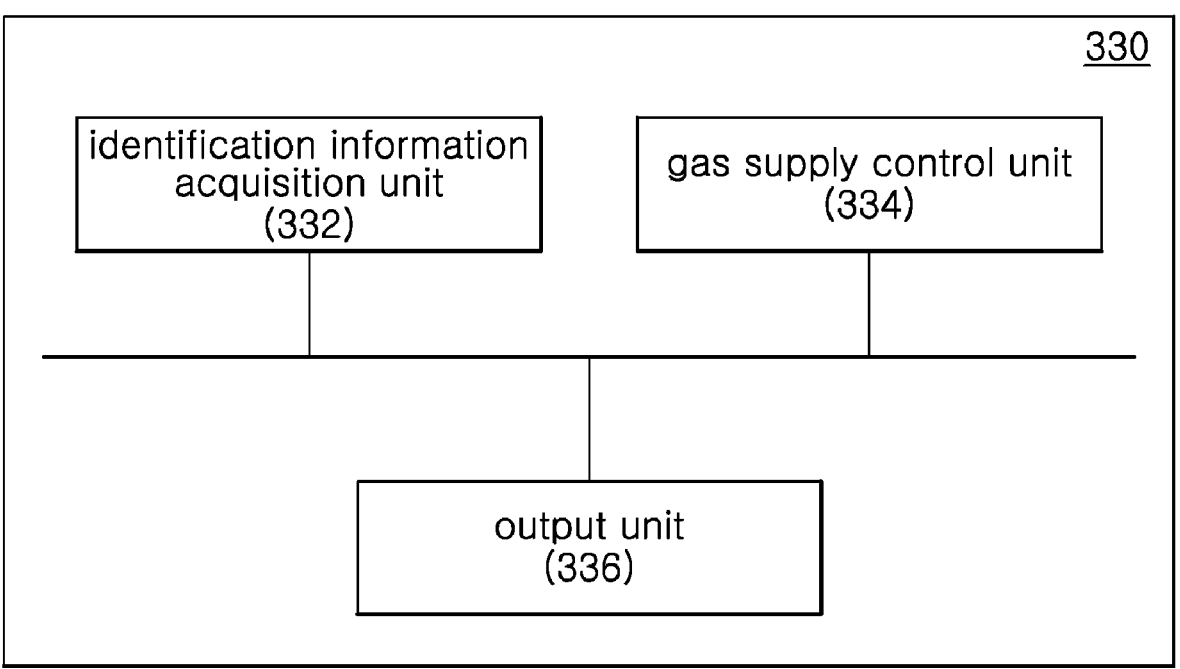
FIG. 4 is a view illustrating the configuration of a control unit of article storage equipment according to an embodiment of the present disclosure.

According to the embodiment of the present disclosure, as illustrated in FIG. 4, the control unit 330 may include: an identification information acquisition unit 332 for acquiring identification information of the transport container 5 from the RFID reader 316; a gas supply control unit 334 for transmitting a control signal instructing supply of the inert gas to the gas supply part 324 when the transport container 5 is identified and receiving information on a supply state of the inert gas from the gas supply part 324; and an output unit 336 for outputting information on a loading state the transport container 5 and the supply state of the inert gas for each of the loading slots 314A in which the transport container 5 is loaded in the storage unit 310.

The identification information acquisition unit 332 may acquire and store identification information (RFID) of the transport container 5 received from the RFID reader 316. In particular, the identification information acquisition unit 332 may provide the identification information and the information on the loading state of the transport container 5 for each of the loading slots 314A in which the transport container 5 is loaded in the storage unit 310 to the gas supply control unit 334 and the output unit 336.

When the identification information and the information on the loading state of the transport container 5 for each of the loading slots 314A are received from the identification information acquisition unit 332, the gas supply control unit 334 may transmit a control signal to cause the gas supply part 324 to supply the inert gas into the transport container 5 loaded in the corresponding loading slot 314A. Meanwhile, the gas supply control unit 334 may determine whether the transport container 5 is loaded from a load sensor (not illustrated) provided for each of the loading slots 314A of the support stage 314, and may control the gas supply part 324 to supply the inert gas when the loading of the transport container 5 is detected by the load sensor. In addition, when it is detected that the transport container 5 is out of a specific loading slot 314A, the gas supply control unit 334 may control the gas supply part 324 to stop the supply of the inert gas in the corresponding loading slot 314A. The gas supply control unit 334 may provide the information on the supply state of the inert gas for each of the loading slots 314A to the output unit 336.

Figure 5:
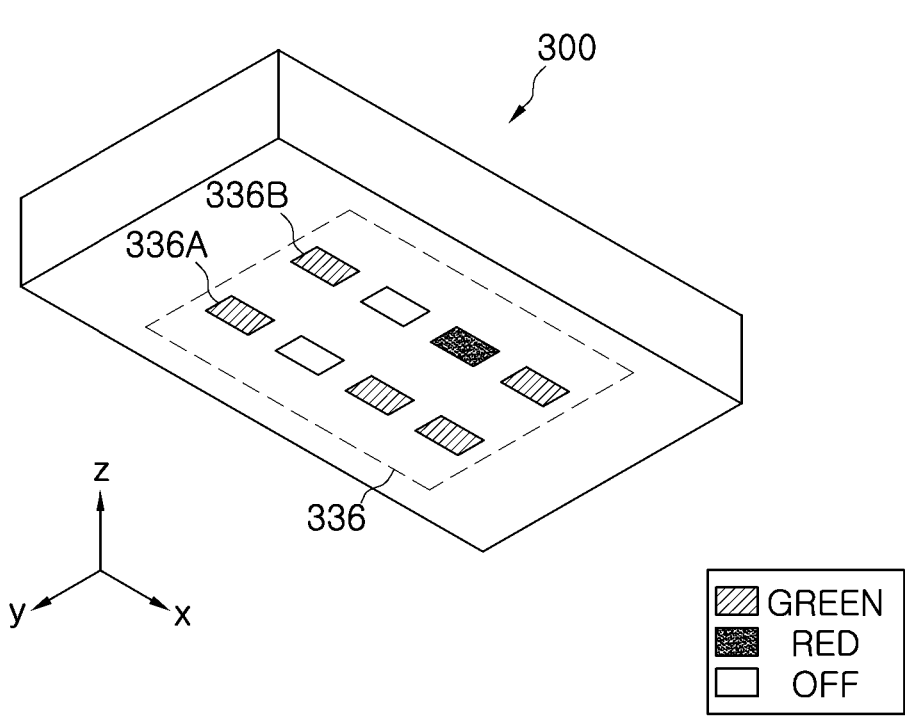
FIG. 5 is a view illustrating an output unit of the control unit according to the embodiment of the present disclosure.

FIG. 5 is a view illustrating the output unit 336 of the control unit 330 according to the embodiment of the present disclosure.

According to the embodiment of the present disclosure, the output unit 336 may include a plurality of light emitting devices 336A and 336B respectively displaying the information on the loading state of the transport container 5 and the supply state of the inert gas for each of the loading slots 314A. The output unit 336 may output the information on the loading state of the transport container 5 for each of the loading slots 314A provided from the identification information acquisition unit 332 to the first light emitting device 336A, and output the information on the supply state of the inert gas for each of the loading slots 314A provided from the gas supply control unit 334 to the second light emitting device 336A. As illustrated in FIG. 5, the first light emitting device 336A and the second light emitting device 336B may be provided to respectively display the information on the loading state of the transport container 5 and the supply state of the inert gas for each of the loading slots 314A. The first light emitting device 336A and the second light emitting device 336B may display an operating state through colors such as green and red, and may be turned off when the transport container 5 does not exists in the loading slot 314A. In addition, the output unit 336 may be implemented as a display panel such as LCD or OLED, and may output information such as an ID of the transport container 5 and an inert gas supply flow rate as well as a loading state and a gas supply state.

According to the embodiment of the present disclosure, the light emitting devices 336A and 336B may be installed to display the information on the loading state of the transport container 5 and the supply state of the inert gas toward a ground surface of the semiconductor fabrication facility. As the light emitting devices 336A and 336B are installed to face the ground surface, workers may easily ascertain the corresponding information.

Figure 6:
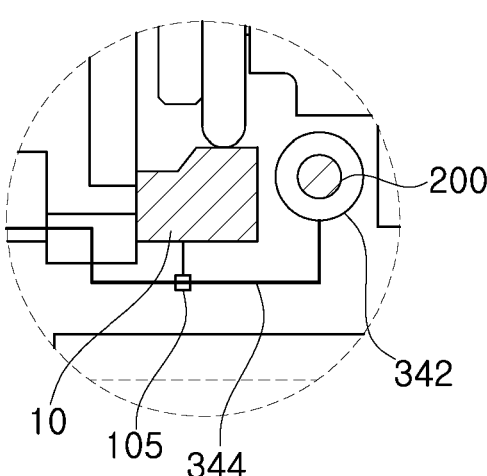
FIGS. 6 and 7 are views illustrating a power supply unit according to the embodiment of the present disclosure.
Figure 7:
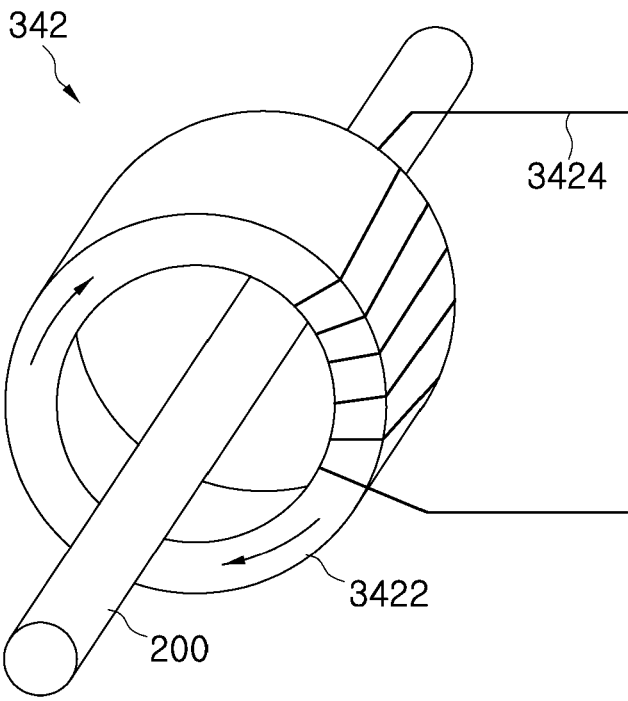

FIGS. 6 and 7 are views illustrating the power supply unit 340 according to the embodiment of the present disclosure.

According to the embodiment of the present disclosure, the power supply unit 340 may include a current converter 342 for inducing a current from the power supply cable 20, and the power supply line 344 for supplying the current from the current converter 342 to the control unit 330. The current converter 342 may be configured in a ring shape surrounding the power supply cable 20 to provide the current induced from the power supply cable 20 to the power supply line 344, and the power supply line 344 may supply power from the current converter 342 to the control unit 330.

Meanwhile, the power supply line 344 may be installed to avoid the moving trajectory of the transport vehicle 100 so as not to interfere with traveling of the transport vehicle 100. According to the embodiment of the present disclosure, the power supply line 344 may be configured to be attached to or embedded in the structures of the rail 10 and the storage unit 310 so as not to interfere with the transport vehicle 100. In other words, the current induced from the power supply cable 20 may be supplied to the control unit 330 along the power supply line 344 coupled to the structures of the rail 10 and the storage unit 310.

As illustrated in FIG. 6, rather than using a method in which a separate power source is provided on the ground surface and a cable is installed in the article storage equipment 30 on the ground surface in order to supply power to the control unit 330, by employing a method in which the control unit 330 is driven by the current induced from the power supply cable 20 installed along the rail 10 to supply power to the transport vehicle 100, the installation operation of the article storage equipment 30 may be greatly simplified. When power is supplied from the ground surface to the article storage equipment 30, many materials and workers are required to install the cable. However, as in the present disclosure, when power is supplied to the control unit 330 using the current induced from the power supply cable 20, only the current converter 342 and the power supply line 344 need to be installed, so installation materials and the number of workers may be reduced.

Referring to FIG. 6, the power supply line 344 may be coupled to a hook-shaped structure 105 provided under the rail 10 to prevent sagging in the power supply line 344. In addition, the power supply line 344 may be installed to be attached to or embedded in the frame 312 of the storage unit 310 so as not to interfere with the transport vehicle 100.

According to the embodiment of the present disclosure, the current converter 342 may include a ring-shaped core member 3422 installed to surround the power supply cable 20 and forming a magnetic field by a current IP flowing along the power supply cable 20, and a coil member 3424 wound around the core member 3422 and inducing a current IS by the magnetic field.

As illustrated in FIG. 7, when the current IP flows along the power supply cable 20, a circular magnetic field is formed in the inner space of the ring-shaped core member 3422 surrounding the power supply cable 20. In addition, the induced current IS induced by the magnetic field may be generated in the coil member 3424 surrounding the core member 3422, and the induced current IS may be supplied to the control unit 330 through the power supply line 344.

Figure 8:
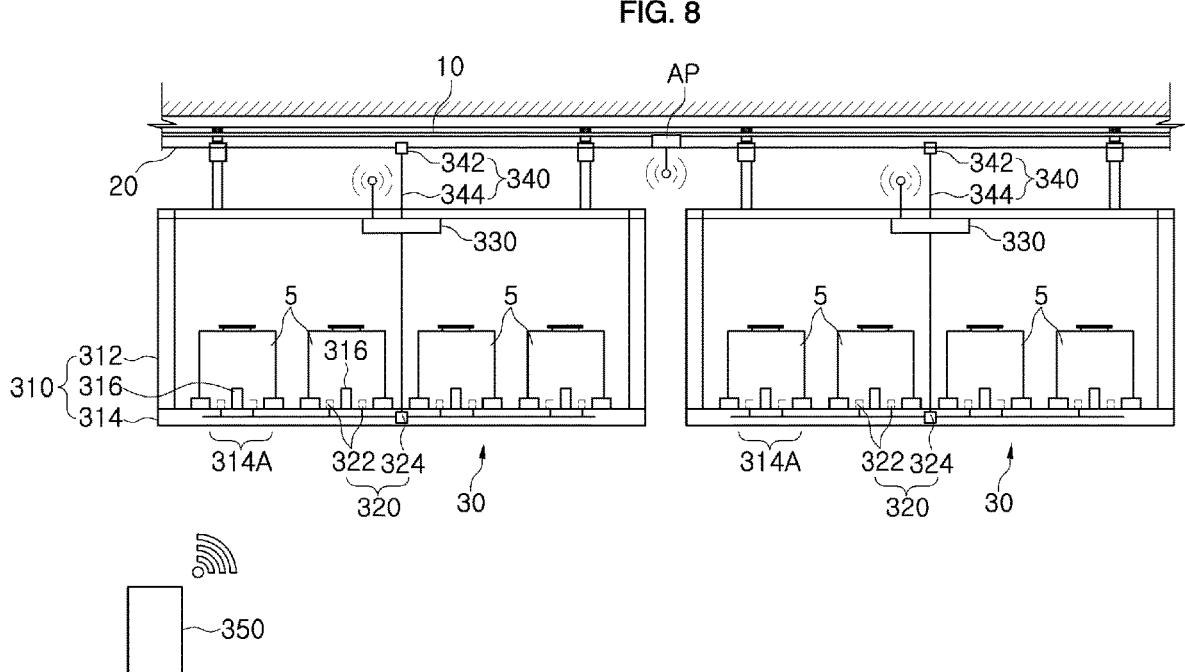
FIG. 8 is a view illustrating another example of a logistics system of a semiconductor fabrication facility according to an embodiment of the present disclosure.
Figure 9:
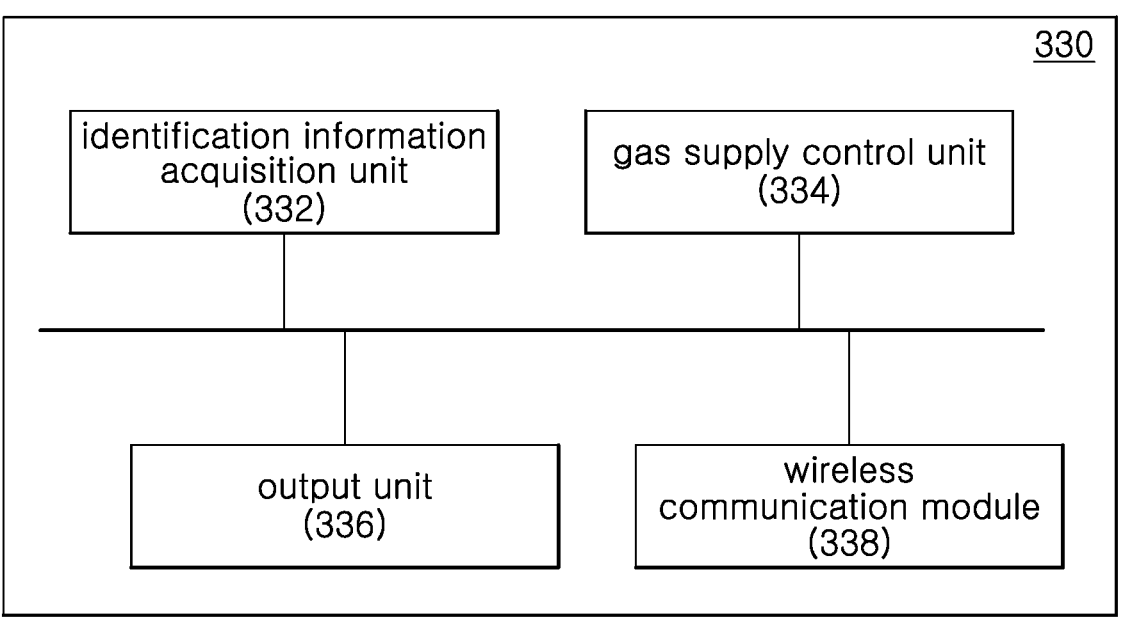
FIG. 9 is a view illustrating the configuration of a control unit of article storage equipment according to an embodiment of the present disclosure.

FIG. 8 is a view illustrating another example of a logistics system of a semiconductor fabrication facility according to an embodiment of the present disclosure.

Article storage equipment 30 in the semiconductor fabrication facility according to the present disclosure may include: a storage unit 310 installed around the rail 10 that provides a travel route of a transport vehicle 100, and storing a transport container 5 in which a wafer is accommodated; a purge unit 320 for supplying an inert gas into the transport container 5; a control unit 330 for identifying the transport container 5 stored in the storage unit 310 and controlling the purge unit 320 to supply the inert gas into the transport container 5; a power supply unit 340 for supplying a current induced from the power supply cable 20 installed along the rail 10 to the control unit 330; and a controller management unit 350 connected to the control unit 330 through wireless communication and managing the operation of the control unit 330.

Referring to FIG. 8, an access point AP for providing a wireless connection may be installed on the ceiling of the fabrication facility. The access point AP may allow the control unit 330 of the article storage equipment 30 to transmit and receive data through wireless communication. In particular, the controller management unit 350 for managing the operation of the control unit 330 may be provided. The controller management unit 350 may allow a worker to check an operating state of each control unit 330 and check information on the transport container 5 stored in each article storage equipment 30. The controller management unit 350 may be installed on the ground surface of the semiconductor fabrication facility to allow easy access of the worker. In addition, the controller management unit 350 may be connected to the control unit 330 wirelessly through the access point AP.

The access point AP may provide a resource for wireless communication to a client device (e.g., the control unit 330, the controller management unit 350), and may provide communication services such as the Internet and Ethernet to the client device by being connected to a higher-level network.

According to the embodiment of the present disclosure, the control unit 330 may include: an identification information acquisition unit 332 for acquiring identification information of the transport container 5 from an RFID reader 316; a gas supply control unit 334 for transmitting a control signal instructing supply of an inert gas to a gas supply part 324 when the transport container 5 is identified and receiving information on a supply state of the inert gas from the gas supply part 324; and an output unit 336 for outputting information on a loading state of the transport container 5 and the supply state of the inert gas for each loading slot 314A in which the transport container 5 is loaded in the storage unit 310. In addition, the control unit 330 may further include a wireless communication module 338 for transmitting the information on the loading state of the transport container 5 and the supply state of the inert gas for each loading slot 314A of a support stage 314 to the controller management unit 350.

Figure 10:
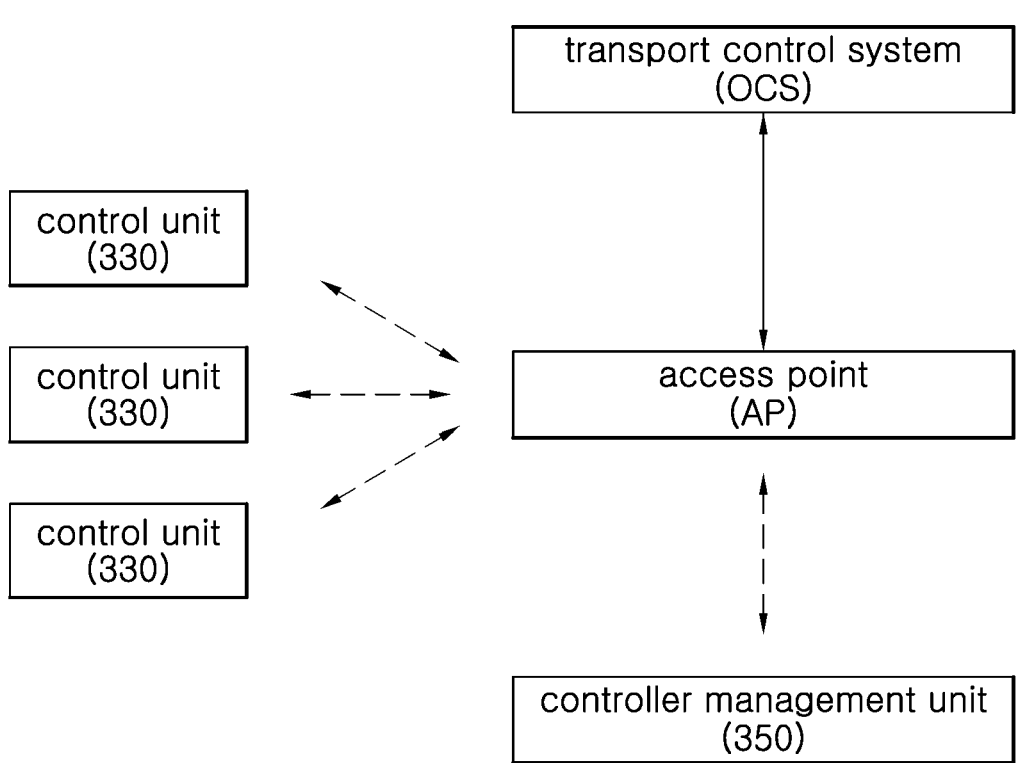
FIG. 10 is a view illustrating an object connection structure of the logistics system of the semiconductor fabrication facility according to the embodiment of the present disclosure.
Figure 11:
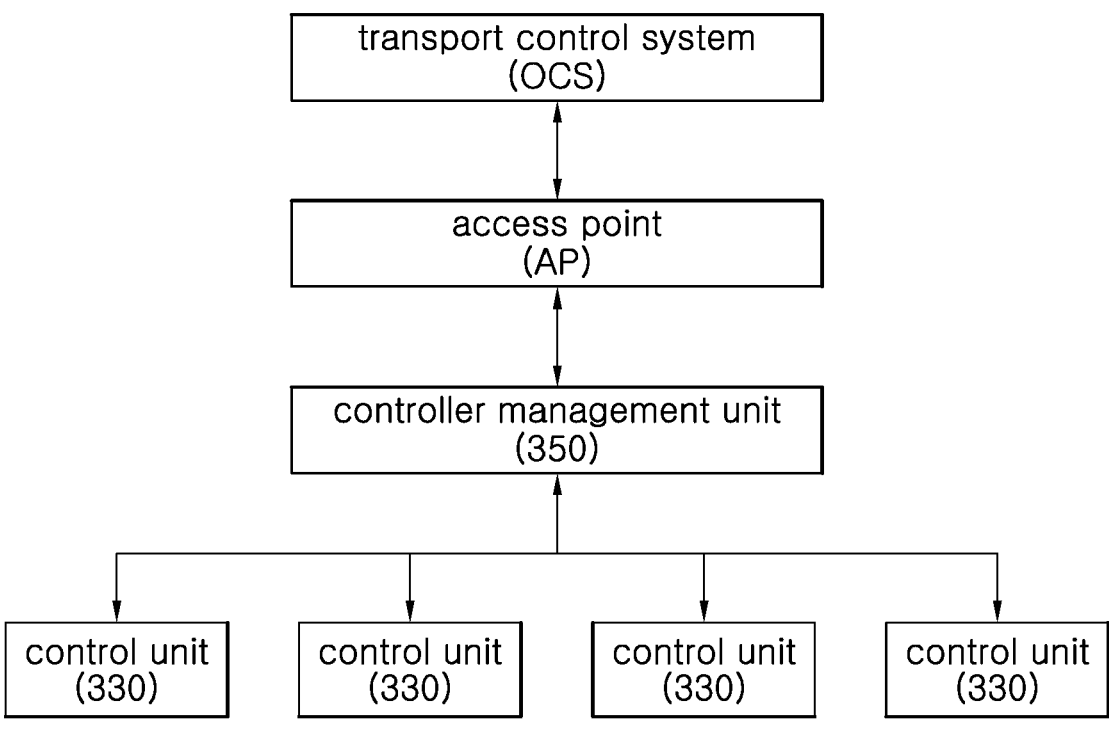
FIG. 11 is a view illustrating a hierarchical structure of the logistics system of the semiconductor fabrication facility according to the embodiment of the present disclosure.

FIG. 10 is a view illustrating an object connection structure of the logistics system of the semiconductor fabrication facility according to the embodiment of the present disclosure. As illustrated in FIG. 10, each control unit 330 and the controller management unit 350 may be wirelessly connected to each other through the access point AP. Meanwhile, the access point AP may be connected to a transport control system, e.g., an OHT control system (OCS), through a network of the semiconductor fabrication facility. The OCS may control the overall operation of a system for transporting articles in the semiconductor fabrication facility. When an event requiring transport of an article occurs, the OCS may control each transport vehicle 100 to move the corresponding article. As illustrated in FIG. 11, the OCS may be connected to the controller management unit 350 through the access point AP, and may obtain information from each control unit 330 of the article storage equipment 30 through the controller management unit 350 or control the operation of each control unit 330.

The OCS may receive information on the transport container 4 loaded in the article storage equipment 30 and information on the supply state of the inert gas through the controller management unit 350. The OCS may transmit location information of the transport container 5 to be transported to the transport vehicle 100 around the transport container 5 to transport the transport container 5. In addition, the OCS may control each control unit 330 through the controller management unit 350.

In addition, since the power for the control unit 330 of the article storage equipment 30 is supplied through the power supply cable 20, the power supplied to the transport vehicle 100 may be reduced in a section where the article storage equipment 30 is installed. For example, in a specific section, the power that the power supply cable 20 can supply may be 200 kW, the power that each transport vehicle 100 requires may be 20 kW, and the total power consumed by the control unit 330 of the article storage equipment 30 may be 20 kW. When the power supplied to the article storage equipment 30 in the specific section is 20 kW and nine transport vehicles 100 are traveling in the specific section, the OCS may allow another transport vehicle 100 to travel on a different route while avoiding the specific section, thereby preventing power overload from occurring in the specific section.

While exemplary embodiments of the present disclosure have been described, those skilled in the art will appreciate that various modifications, additions, and substitutions are possible, without departing from the scope and spirit of the present disclosure.

The scope of the present disclosure should be defined only by the accompanying claims, and all technical ideas within the scope of equivalents should be construed as falling within the scope of the present disclosure.

What is claimed is:

1. Article storage equipment in a semiconductor fabrication facility, the article storage equipment comprising:
    a storage unit installed around a rail that provides a travel route of a transport vehicle and configured to store a transport container in which a wafer is accommodated;
    a purge unit configured to supply an inert gas into the transport container;
    a control unit configured to identify the transport container stored in the storage unit and control the purge unit to supply the inert gas into the transport container; and
    a power supply unit configured to supply a current induced from a power supply cable installed along the rail to the control unit,
    wherein the power supply unit comprises:
    a current converter configured to induce a current from the power supply cable; and
    a power supply line attached to or embedded in structures of the rail and the storage unit so as not to interfere with the transport vehicle and configured to supply the current from the current converter to the control unit, and
    wherein the current converter comprises:
    a ring-shaped core member installed to surround the power supply cable and configured to form a magnetic field by a current flowing along the power supply cable; and
    a coil member wound around the ring-shaped core member and configured to induce a current by the magnetic field.

2. The article storage equipment of claim 1, wherein the storage unit comprises:
    a frame installed on a side of the rail;
    a support stage installed on a lower surface of the frame and configured to allow the transport container to be loaded thereon; and an RFID reader installed on the support stage and configured to acquire identification information of the transport container and transmit the identification information to the control unit.

3. The article storage equipment of claim 2, wherein the purge unit comprises:

a gas supply port installed in a loading slot of the support stage and configured to communicate with a gas inlet hole formed in the transport container when the transport container is mounted in the loading slot; and a gas supply part configured to supply the inert gas into the transport container through the gas supply port in response to a control signal received from the control unit.

4. The article storage equipment of claim 3, wherein the gas supply part transmits information on a supply state of the inert gas to the control unit.

5. The article storage equipment of claim 4, wherein the control unit comprises:

an identification information acquisition unit configured to acquire the identification information of the transport container from the RFID reader;

a gas supply control unit configured to transmit the control signal to the gas supply part when the transport container is identified and receive the information on the supply state of the inert gas from the gas supply part; and an output unit configured to output information on a loading state of the transport container and the supply state of the inert gas for each loading slot in which the transport container is loaded in the storage unit.

6. The article storage equipment of claim 5, wherein the output unit comprises a plurality of light emitting devices configured to respectively display the information on the loading state of the transport container and the supply state of the inert gas for each loading slot.

7. The article storage equipment of claim 6, wherein the plurality of light emitting devices are installed to display the information on the loading state of the transport container and the supply state of the inert gas toward a ground surface of the semiconductor fabrication facility.

8. Article storage equipment in a semiconductor fabrication facility, the article storage equipment comprising:

a storage unit installed around a rail that provides a travel route of a transport vehicle and configured to store a transport container in which a wafer is accommodated;

a purge unit configured to supply an inert gas into the transport container;

a control unit configured to identify the transport container stored in the storage unit and control the purge unit to supply the inert gas into the transport container;

a power supply unit configured to supply a current induced from a power supply cable installed along the rail to the control unit; and a controller management unit connected to the control unit through wireless communication and configured to manage operation of the control unit-, wherein the power supply unit comprises:

a current converter configured to induce a current from the power supply cable; and a power supply line attached to or embedded in structures of the rail and the storage unit so as not to interfere with the transport vehicle and configured to supply the current from the current converter to the control unit, and wherein the current converter comprises:

a ring-shaped core member installed to surround the power supply cable and configured to form a magnetic field by a current flowing along the power supply cable; and a coil member wound around the ring-shaped core member and configured to induce a current by the magnetic field.

9. The article storage equipment of claim 8, wherein the storage unit comprises:

a frame installed on a side of the rail;

a support stage installed on a lower surface of the frame and configured to allow the transport container to be loaded thereon; and an RFID reader installed on the support stage and configured to acquire identification information of the transport container and transmit the identification information to the control unit.

10. The article storage equipment of claim 9, wherein the purge unit comprises:

a gas supply port installed on the support stage and configured to communicate with a gas inlet hole formed in the transport container when the transport container is mounted on the support stage; and a gas supply part configured to supply the inert gas into the transport container through the gas supply port in response to a control signal received from the control unit.

11. The article storage equipment of claim 10, wherein the gas supply part transmits information on a supply state of the inert gas to the control unit.

12. The article storage equipment of claim 11, wherein the control unit comprises:

an identification information acquisition unit configured to acquire the identification information of the transport container from the RFID reader;

a gas supply control unit configured to transmit the control signal to the gas supply part when the transport container is identified and receive the information on the supply state of the inert gas from the gas supply part; and an output unit configured to output information on a loading state of the transport container and the supply state of the inert gas for each loading slot in which the transport container is loaded in the storage unit.

13. The article storage equipment of claim 12, wherein the output unit comprises a plurality of light emitting devices configured to respectively display the information on the loading state of the transport container and the supply state of the inert gas for each support stage, and wherein the plurality of light emitting devices are installed to display the information on the loading state of the transport container and the supply state of the inert gas toward a ground surface of the semiconductor fabrication facility.

14. The article storage equipment of claim 12, wherein the control unit further comprises a wireless communication module configured to transmit the information on the loading state of the transport container and the supply state of the inert gas for each support stage to the controller management unit.

15. The article storage equipment of claim 14, wherein the control unit and the controller management unit perform wireless communication through an access point installed on a ceiling of the semiconductor fabrication facility, and wherein the controller management unit is provided on a ground surface of the semiconductor fabrication facility, and receives the information on the loading state of the transport container and the supply state of the inert gas from the control unit through the access point and transmits a signal for controlling the control unit to the control unit.

16. A logistics system of a semiconductor fabrication facility, the logistics system comprising:

a rail installed on a ceiling of the semiconductor fabrication facility and configured to provide a travel path of a transport vehicle;

a power supply cable installed along the rail and configured to supply power to the transport vehicle; and article storage equipment configured to store a transport container from the transport vehicle, wherein the article storage equipment comprises:

a storage unit installed around the rail and configured to store the transport container in which a wafer is accommodated;

a purge unit configured to supply an inert gas into the transport container;

a control unit configured to identify the transport container stored in the storage unit and control the purge unit to supply the inert gas into the transport container;

a power supply unit configured to supply a current induced from the power supply cable to the control unit; and a controller management unit connected to the control unit through wireless communication and configured to manage operation of the control unit, wherein the power supply unit comprises:

a current converter configured to induce a current from the power supply cable; and a power supply line attached to or embedded in structures of the rail and the storage unit so as not to interfere with the transport vehicle and configured to supply the current from the current converter to the control unit, and wherein the current converter comprises:

a ring-shaped core member installed to surround the power supply cable and configured to form a magnetic field by a current flowing along the power supply cable; and a coil member wound around the ring-shaped core member and configured to induce a current by the magnetic field.

* * * * *